US012203666B2

(12) United States Patent
Hika et al.

(10) Patent No.: US 12,203,666 B2
(45) Date of Patent: Jan. 21, 2025

(54) ELECTRICAL COMPONENT MODULE

(71) Applicant: FUJITSU GENERAL LIMITED, Kanagawa (JP)

(72) Inventors: Yasushi Hika, Kanagawa (JP); Yukine Hatakeyama, Kanagawa (JP); Yuri Sugawara, Kanagawa (JP); Hideki Masago, Kanagawa (JP)

(73) Assignee: FUJITSU GENERAL LIMITED, Kanagawa (JP)

( * ) Notice: Subject to any disclaimer, the term of this patent is extended or adjusted under 35 U.S.C. 154(b) by 1033 days.

(21) Appl. No.: 16/963,989

(22) PCT Filed: Jan. 25, 2019

(86) PCT No.: PCT/JP2019/002553
§ 371 (c)(1),
(2) Date: Jul. 22, 2020

(87) PCT Pub. No.: WO2019/146766
PCT Pub. Date: Aug. 1, 2019

(65) Prior Publication Data
US 2021/0033291 A1  Feb. 4, 2021

(30) Foreign Application Priority Data

Jan. 26, 2018  (JP) ................................ 2018-011161
Jan. 24, 2019  (JP) ................................ 2019-010446

(51) Int. Cl.
*F24F 1/24* (2011.01)
*H05K 7/14* (2006.01)
*H05K 7/20* (2006.01)

(52) U.S. Cl.
CPC ............. *F24F 1/24* (2013.01); *H05K 7/1417* (2013.01); *H05K 7/2039* (2013.01)

(58) Field of Classification Search
CPC ............ F24F 1/24; F24F 1/22; H05K 7/1417; H05K 7/2039; H05K 7/20936
See application file for complete search history.

(56) References Cited

U.S. PATENT DOCUMENTS 9,523,529 B2    12/2016  Oguri et al.
2012/0194041 A1*  8/2012  Hika .................... F24F 1/46
312/100

(Continued)

FOREIGN PATENT DOCUMENTS

| CN | 104374028 | 2/2015 |
| CN | 106369685 | 2/2017 |

(Continued)

OTHER PUBLICATIONS

Tanaka English Translation (Year: 2010).*

(Continued)

*Primary Examiner* — Nelson J Nieves
*Assistant Examiner* — Matthew John Moscola
(74) *Attorney, Agent, or Firm* — GREENBLUM & BERNSTEIN, P.L.C.

(57) ABSTRACT

An electrical component module includes: a control unit that controls an air conditioner; a fixed plate on which the control unit is mounted, the fixed plate being arranged to have a front surface facing a direction toward a service panel; a cooler that is attached to a part of a refrigerant pipe with the refrigerant pipe arranged between the cooler and a back surface of the fixed plate; a first frame attached to one end portion of the fixed plate; and a second frame attached to another end portion of the fixed plate. The control unit includes a printed circuit board on which a power device is mounted. The power device is thermally coupled with the cooler. The cooler is attached to bridge between the first frame and the second frame.

6 Claims, 14 Drawing Sheets

(56) References Cited

U.S. PATENT DOCUMENTS

| | | | |
|---|---|---|---|
| 2016/0174411 A1 | 6/2016 | Lee et al. | |
| 2018/0187905 A1 | 7/2018 | Doi et al. | |
| 2019/0271477 A1* | 9/2019 | Takeuchi | F24F 1/56 |

FOREIGN PATENT DOCUMENTS

| | | | |
|---|---|---|---|
| JP | S63-026027 U | | 2/1988 |
| JP | 2009-299957 | | 12/2009 |
| JP | 2010-175231 | | 8/2010 |
| JP | 2010175231 A | * | 8/2010 |
| JP | 2010-196926 | | 9/2010 |
| JP | 2011-099577 | | 5/2011 |
| JP | 2011099577 A | * | 5/2011 |
| JP | 2012-137229 | | 7/2012 |
| JP | 2012-177539 | | 9/2012 |
| JP | 5472364 | | 4/2014 |
| JP | 2016-099043 | | 5/2016 |
| JP | 2016-109314 | | 6/2016 |
| WO | 2017/013951 | | 1/2017 |

OTHER PUBLICATIONS

International Search Report issued in International Patent Application No. PCT/JP2019/002553, dated Mar. 26, 2019.

Written Opinion of the International Searching Authority issued in International Application No. PCT/JP2019/002553, dated Mar. 26, 2019.

Japanese Office Action dated Sep. 21, 2021 issued in Japanese Patent Application No. 2019-176110, along with corresponding English translation.

Chinese Office Action dated Mar. 26, 2021 issued in Chinese Patent Application No. 201980010210.X, with corresponding English translation.

* cited by examiner

ELECTRICAL COMPONENT MODULE

FIELD

The present invention relates to an electrical component module attached to a machine section provided behind a service panel arranged on a front side of an outdoor unit of an air conditioner.

BACKGROUND

As illustrated in FIG. 13, a general air conditioner includes an outdoor unit 10 installed outdoors and an indoor unit 20 installed indoors. The outdoor unit 10 and the indoor unit 20 are connected to each other by a refrigerant pipe 30 to form a vapor compression refrigeration cycle.

The outdoor unit 10 is provided with an outdoor heat exchanger 11 for implementing heat exchange between outdoor air and a refrigerant, a blower fan 11F, a compressor 12 that compresses the refrigerant, an oil separator 13 that separates a lubricant from a mixture fluid that is discharged from the compressor 12 and includes the lubricant and the refrigerant, an expansion valve 14 for expanding the inflowing refrigerant to reduce the pressure to a predetermined pressure, an accumulator 15 for separating the inflowing refrigerant into gas and liquid, and a four-way valve 16 for switching between a heating operation and a cooling operation. Furthermore, the indoor unit 20 is provided with an indoor heat exchanger 21 for implementing heat exchange between indoor air and the refrigerant, a blower fan 21F, and the like. The outdoor heat exchanger 11, the compressor 12, the oil separator 13, the expansion valve 14, the accumulator 15, the four-way valve 16, and the indoor heat exchanger 21 are connected to each other by a refrigerant pipe 30. The refrigerant pipe 30 includes a liquid side refrigerant pipe 30L and a gas side refrigerant pipe 30G.

As illustrated in FIG. 14, the outdoor unit 10 includes a housing 17 the internal space of which is divided by a partition plate 171 into a heat exchange section 10A and a machine section 10B that are arranged side by side in the left and right direction. The heat exchange section 10A accommodates the outdoor heat exchanger 11 and the blower fan 11F. The compressor 12, the oil separator 13, the expansion valve 14, the accumulator 15, the four-way valve 16, and the like are accommodated in the machine section 10B, and are visible from the outside when a service panel not illustrated on the front side of the housing 17 is removed, as illustrated in FIG. 14.

The machine section 10B further accommodates an electrical component module 40 that is arranged at a substantially middle position in an upward and downward direction. The electrical component module 40 is a module on which a control circuit that controls an operation of the air conditioner as a whole, a setting circuit for making various settings on the air conditioner, a display circuit for displaying the status of the air conditioner, a converter circuit that converts AC power supplied from the outside into DC power and outputs the DC power, an inverter circuit that converts the DC power output from the converter circuit into AC power and outputs the AC power, other circuits, and the like are mounted. A plurality of electronic components for implementing these circuits is mounted on a printed circuit board 41. The printed circuit board 41 is configured as a single board so that a space for the pipe can be secured therebehind in the machine section 10B.

FIG. 15 is a front view of the electrical component module 40. The printed circuit board 41 is attached in an upright posture inside the machine section 10B. The printed circuit board 41 is divided into a low voltage region 41A and a high voltage region 41B in the upward and downward direction.

In the low voltage region 41A, low voltage electronic components are mounted. The low voltage electronic components include: an electronic component such as a microcomputer that is a part of the control circuit described above; an electronic component for operating components of the setting circuit such as a switch 41A1 and a low power connector 41A2 to and from which a plug is inserted or pulled out; and a low voltage electronic component such as an LED 41A3 that is a part of the display circuit. In the high voltage region 41B, a plurality of high voltage electronic components is mounted, which are the remaining components of the control circuit described above that perform the power conversion. Examples of such components include: a power device 41B1 such as an IC in the converter circuit or an IC in the inverter circuits a large capacity electrolytic capacitor 41B2 for smoothing; a large capacity connector 41B3; and the like.

The high voltage region 41B is further provided with a cooler 50 that cools the heat produced by the power device 41B1. The cooler 50 includes a heat sink (not illustrated) shaped to be attachable to the liquid side refrigerant pipe 30L of the refrigerant pipe 30. The heat sink is arranged to be thermally coupled with the printed circuit board 41 to receive the heat produced by the power device 41B1, with the front side of the printed circuit board 41 facing the service panel (not illustrated). In the liquid side refrigerant pipe 30L, the refrigerant condensed in the outdoor heat exchanger 11 flows during the cooling operation, and the refrigerant condensed in the indoor heat exchanger 21 and decompressed in the expansion valve 14 flows during the heating operation. Thus, the heat sink of the cooler 50 is cooled on the basis of the temperature of the refrigerant, whereby the temperature of the power device 41B1 is maintained to be at or lower than a predetermined value. The air conditioner described above is described in Patent Document 1.

CITATION LIST

Patent Literature

Patent Literature 1: Japanese Patent No. 5472364

SUMMARY

Technical Problem

The outdoor unit 10 described above has the cooler 50 disposed on the front side of the printed circuit board 41 facing the service panel used for accessing the internal space. Thus, when maintenance work for the printed circuit board 41 such as replacement is performed, the refrigerant pipe 30 and the heat sink need to be removed from the front side of the printed circuit board 41. Thus, there is a disadvantage that the maintenance work for the printed circuit board 41 requires a skilled hand. On top of that, there is a problem in that the mechanical strength of the supporting structure of the printed circuit board 41 against vibration and the like is low, because the above-described electrical component module 40 has the cooler 50 supported by the printed circuit board 41.

The disclosed technique is made in view of the above, and aims to provide an electrical component module enabling the printed circuit board to be easily maintained without the need for detaching the cooler, and enabling the mechanical strength of the supporting structure of the printed circuit board to be increased with a simple structure.

Solution to Problem

An electrical component module attached to a machine section provided behind a service panel arranged on a front side of an outdoor unit of an air conditioner including a refrigerant pipe, the electrical component module disclosed in this application, according to an aspect, includes: a control unit that controls the air conditioner; a fixed plate on which the control unit is mounted, the fixed plate being arranged to have a front surface facing a direction toward the service panel; a cooler that is attached to a part of the refrigerant pipe with the refrigerant pipe arranged between the cooler and a back surface of the fixed plate; a first frame attached to one end portion of the fixed plate; and a second frame attached to another end portion of the fixed plate, wherein the control unit includes a printed circuit board on which a power device is mounted, the power device is thermally coupled with the cooler, and the cooler is attached to bridge between the first frame and the second frame.

Advantageous Effects of Invention

An aspect of the electrical component module disclosed in the present application enables the printed circuit board to be easily maintained without the need for detaching the cooler, and enables the mechanical strength of the supporting structure of the printed circuit board to be increased with a simple structure.

DESCRIPTION OF EMBODIMENTS

Figure 1:
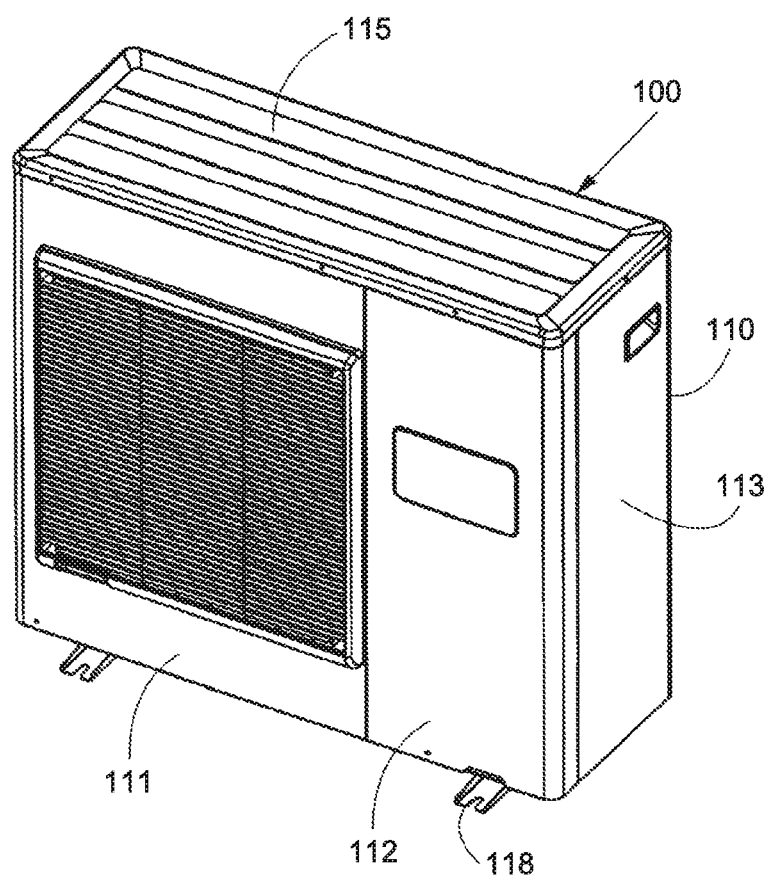
FIG. 1 is a perspective view of an outdoor unit according to an embodiment.
Figure 2:
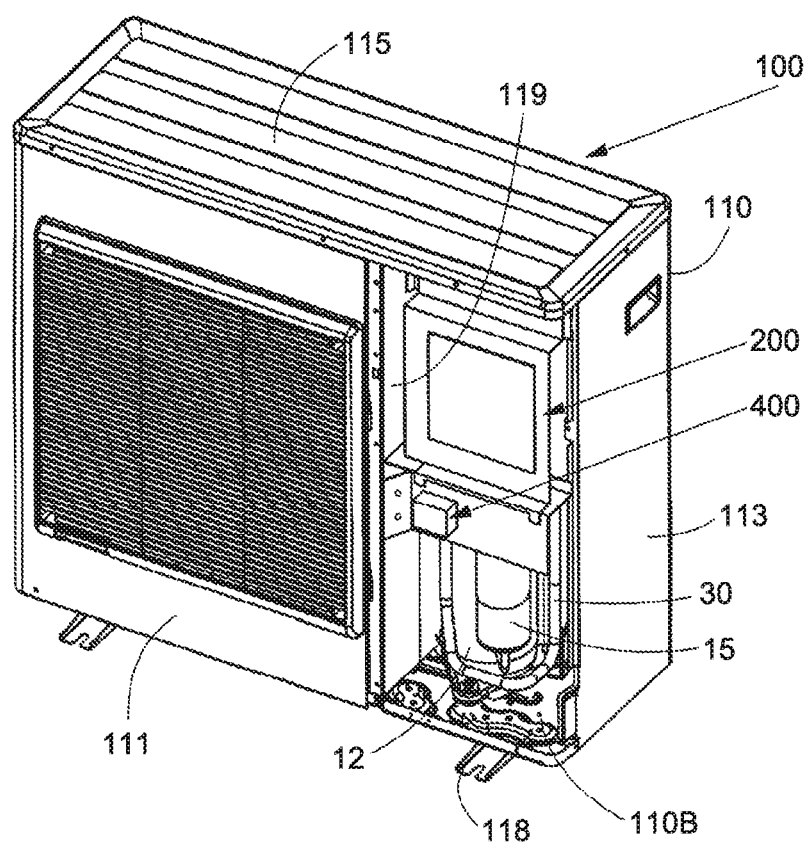
FIG. 2 is a perspective view of the outdoor unit with a service panel removed.
Figure 3:
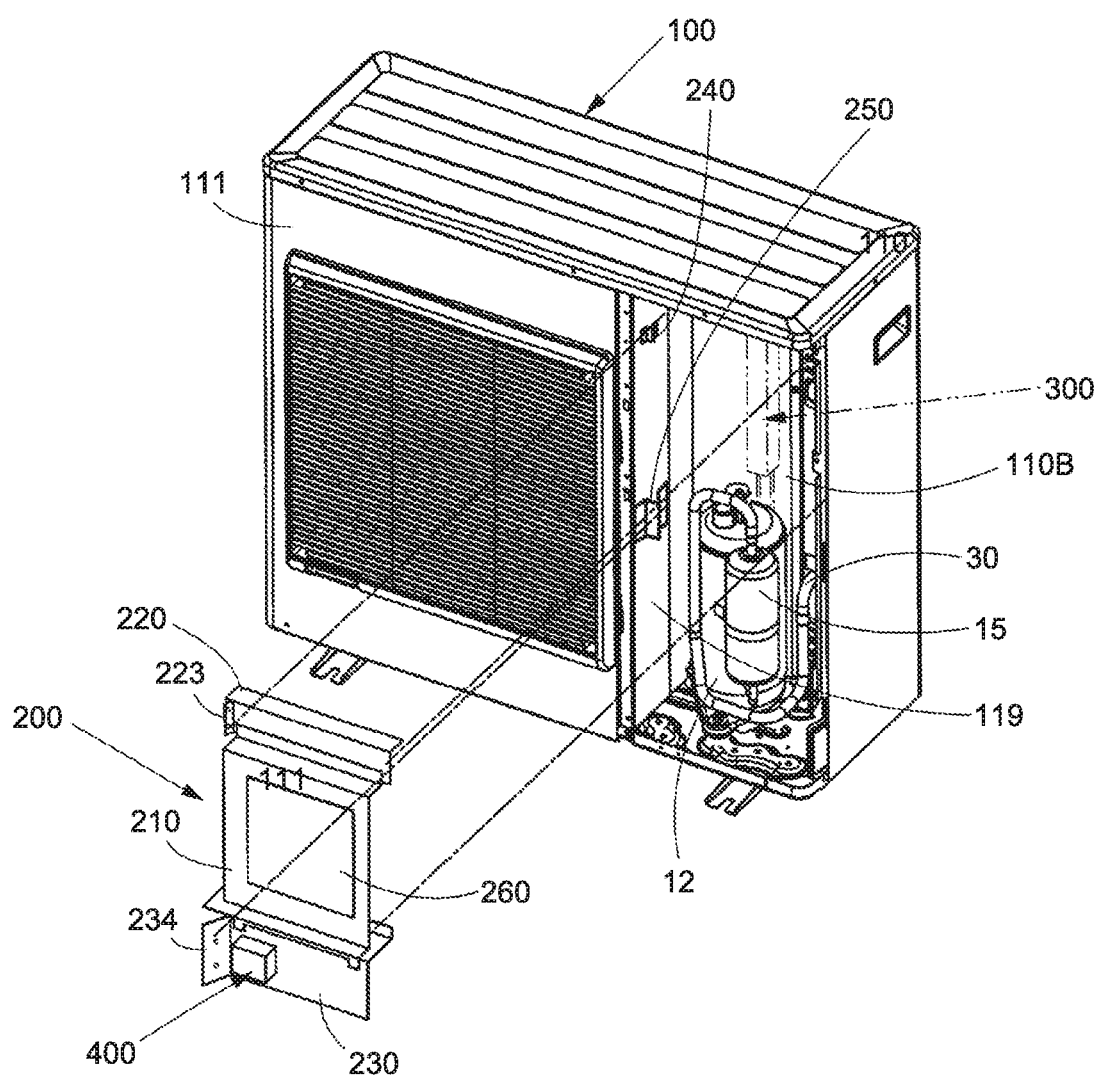
FIG. 3 is a perspective view of the outdoor unit in a state where an electrical component module is removed from a machine section.
Figure 4:
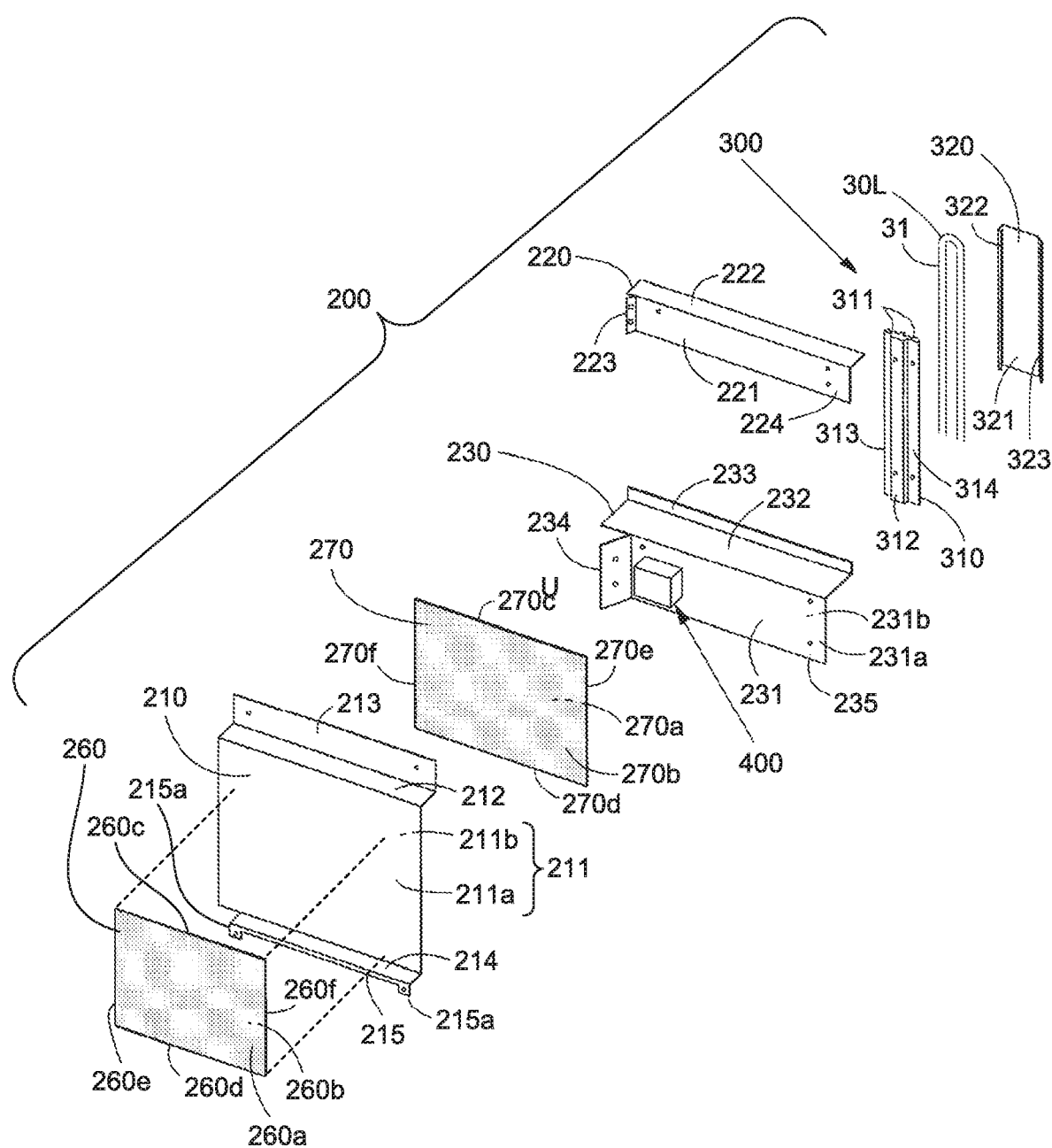
FIG. 4 is an exploded perspective view of the electrical component module and a cooler.

Hereinafter, embodiments of an electrical component module disclosed in the present application will be described in detail with reference to the drawings. The electrical component module disclosed in the present application is not limited to the embodiments described below. FIGS. 1 to 3, FIG. 8, and FIG. 9 illustrate an outdoor unit 100 according to an embodiment of the present invention. The outdoor unit 100 has a housing 110 including: a front panel 111; a service panel 112 on the right side of the front panel 111; a right side panel 113; a left side panel 114; a top panel 115; a back panel 116, and a bottom panel 117. Stands 118 are attached to the bottom panel 117. The internal space of the housing 110 is divided by a partition plate 119, in a left and right direction, into a heat exchange section 110A and a machine section 110B respectively provided behind the front panel 111 and the service panel 112. The partition plate 119 is a part of a wall surface of the machine section 110B. The heat exchange section 110A accommodates the outdoor heat exchanger 11 and the blower fan 11F described above. Furthermore, the machine section 110B accommodates the refrigerant pipe 30, the compressor 12, the expansion valve 14, the accumulator 15, sub-accumulator 15A, the four-way valve 16, and the like described above. The internal space of the machine section 110B can be viewed from the front side of the outdoor unit 100 when the service panel 112 is removed.

As illustrated in FIGS. 4 to 9, electrical component module 200 includes: a fixed plate 210 that is disposed in the machine section 110B to have the front surface facing the back surface of the service panel 112; an upper frame 220 to which an upper portion of the fixed plate 210 serving as one end portion is attached, the upper frame 220 serving as a first frame that has an elongated shape; a lower frame 230 to which a lower portion of the fixed plate 210 serving as the other end portion is attached, the lower frame 230 serving as a second frame that has an elongated shape; an attachment metal fitting 240 with which the upper frame 220 is attached to the partition plate 119; an attachment metal fitting 250 with which the lower frame 230 is attached to the partition plate 119; a main board 260 on which the electronic components forming a part of the control circuit serving as a control unit as well as other electronic components are mounted; and a power board 270 on which the electronic components forming the remaining part of the control circuit and other electronic components, as well as a plurality of power devices 274 described later are mounted.

Thus, the printed circuit board of the electrical component module 200 is divided into the main board 260 and the power board 270. The main board 260 serving as the printed circuit board is mounted on the fixed plate 210 to have a back surface 260b described later facing a front surface 211a of the fixed plate 210 described later. The power board 270 serving as the printed circuit board is mounted on the fixed plate 210 to have a back surface 270b described later facing a back surface 211b of the fixed plate 210 described later. The fixed plate 210 is arranged to have the front surface 211a facing the direction toward the service panel 112. The fixed plate 210 is arranged with the direction of connection between the upper part and the lower part of the fixed plate 210 being in parallel with the upward and downward direction of the machine section 110B.

The electrical component module 200 further includes a cooler 300 that is attached to a part of a refrigerant pipe 30L, with the refrigerant pipe 30L sandwiched between the back surface 211b of the fixed plate 210 and the cooler 300. As described later, the cooler 300 is attached to the upper frame 220 and the lower frame 230 so as to bridge between the upper frame 220 and the lower frame 230, with a U-shaped bent portion 31 of the refrigerant pipe 30L attached to the cooler 300.

The fixed plate 210 includes: a main body portion 211 having the front surface 211a on which the main board 260 is mounted and the back surface 211b on which the power board 270 is mounted; an upper horizontal piece 212 for reinforcement that is bent by 90 degrees from the upper end of the main body portion 211 toward the back surface 211b; and an upper vertical piece 213 for attachment that is bent upward by 90 degrees from the rear edge of the upper horizontal piece 212. The fixed plate 210 further includes: a lower horizontal piece 214 for reinforcement that is bent by 90 degrees from the lower end of the main body portion 211 toward the front surface 211a; and a lower vertical piece 215 for attachment that is bent downward by 90 degrees from the front edge of the lower horizontal piece 214. The lower vertical piece 215 has both ends provided with attachment portions 215a protruding downward.

The upper frame 220 includes: a vertical piece 221 screwed to the upper vertical piece 213 of the fixed plate 210; an upper horizontal piece 222 for reinforcement that is bent backward by 90 degrees from the upper end of the vertical piece 221; and an attachment piece 223 that is bent forward by 45 degrees from the left end of the vertical piece 221. The upper end portion of the cooler 300 is attached to an end portion 224 of the upper frame 220.

The lower frame 230 includes: a lower vertical piece 231 screwed to the lower vertical piece 215 of the fixed plate 210; an upper horizontal piece 232 for reinforcement that is bent backward by 90 degrees from the upper end of the lower vertical piece 231; an upper vertical piece 233 for reinforcement that is bent upward by 90 degrees from the back end of the upper horizontal piece 232; and an attachment piece 234 that is bent forward by 45 degrees from the left end of the lower vertical piece 231. Then, a terminal board 400 is attached to the front side of the lower vertical piece 231. The lower end portion of the cooler 300 is attached to an end portion 235 of the lower frame 230.

The cooler 300 includes: a heat sink 310 made of aluminum that is thermally coupled with the plurality of power devices 274, which will be described later, mounted on a front surface 270a of the power board 270; the U-shaped bent portion 31 of the liquid side refrigerant pipe 301 fit in two grooves 311 that are formed in the heat sink 310 and have semicircular cross sections; and a cover 320 that is made of sheet metal and is used for fixing the U-shaped bent portion 31 on the heat sink 310. In addition to the grooves 311, the heat sink 310 includes: a thick plate portion 312 against which the power devices 274 are pressed for the thermal coupling; and cover attachment portions 313 and 314 formed on both sides of the thick plate portion 312. The cover 320 includes: a holding portion 321 at the center with which the U-shaped bent portion 31 of the liquid side refrigerant pipe 30L is pressed; a hook portion 322 bent from one end of the holding portion 321; and an attachment portion 323 bend from the other end of the holding portion 321 to face the hook portion 322.

Figure 10:
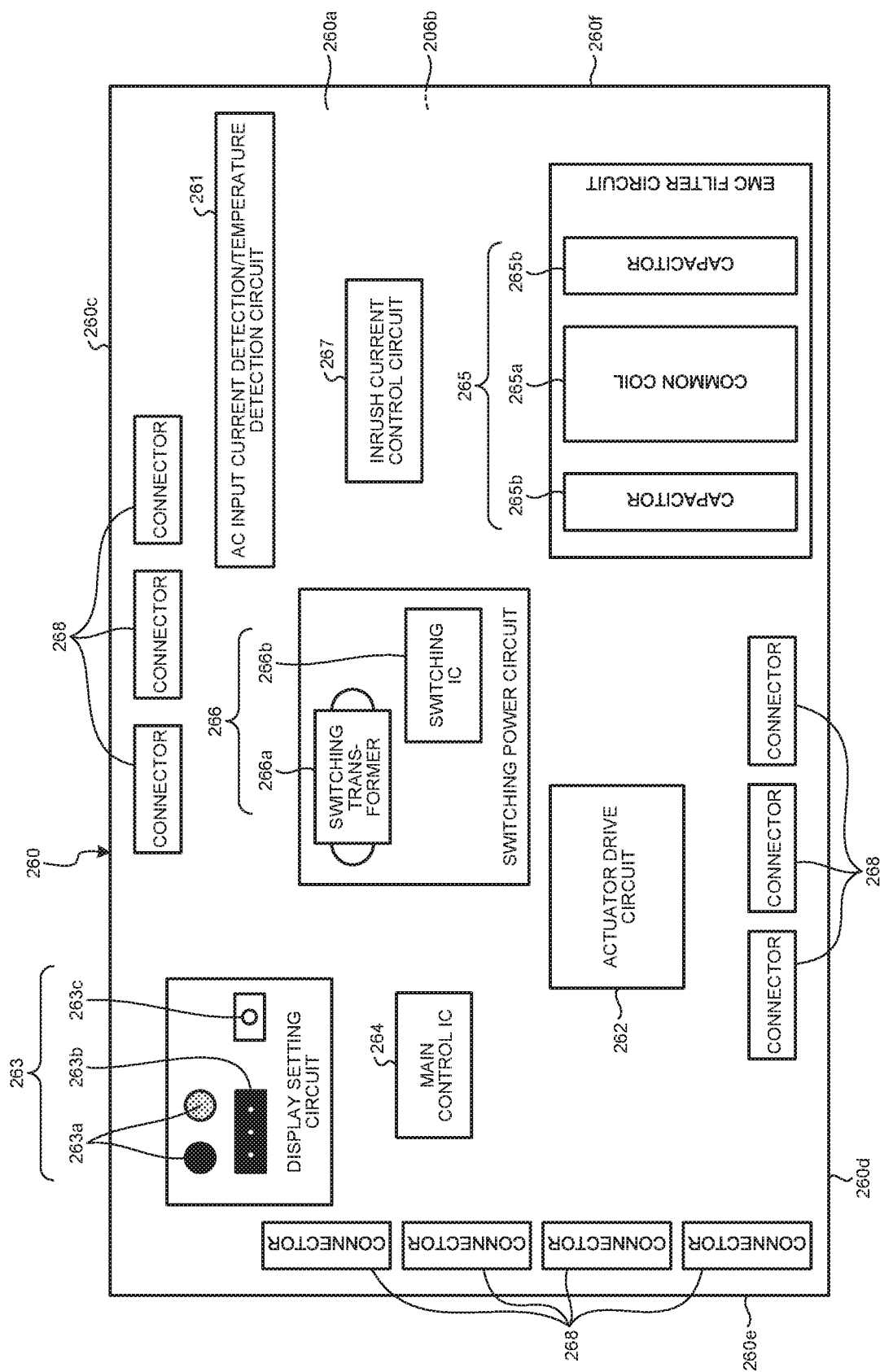
FIG. 10 is a front view of a main board.

On the front surface 260a of the main board 260, the electronic components forming a part of the control circuit and other electronic components are mounted as described above. Specifically, as illustrated in FIG. 10, the components mounted on the front surface 260a of the main board 260 include: an AC input current detection/temperature detection circuit 261; an actuator drive circuit 262 that drives the expansion valve 14 and the four-way valve 16; a display setting circuit 263 including an LED lamp 263a serving as a display unit as well as a DIP switch 263b and a button switch 263c serving as an operation unit, and the like; a main control IC 264 such as a microcomputer; an electromagnetic compatibility (EMC) filter circuit 265 for countering internal and external noise including a common mode choke coil 265a and capacitors 265b; a switching power circuit 266 including a switching transformer 266a and a switching IC 266b; an inrush current control circuit 267; and a plurality of connectors 268 arranged in a peripheral portion. The reference numeral 260b denotes the back surface of the main board 260. The main board 260 is formed in a rectangular shape and has an upper end 260c, a lower end 260d, a left end 260e, and a right end 260f. The main board 260 is mounted on the front surface 211a of the main body portion 211 of the fixed plate 210 to have the back surface 260b facing the front surface 211a.

Figure 11:
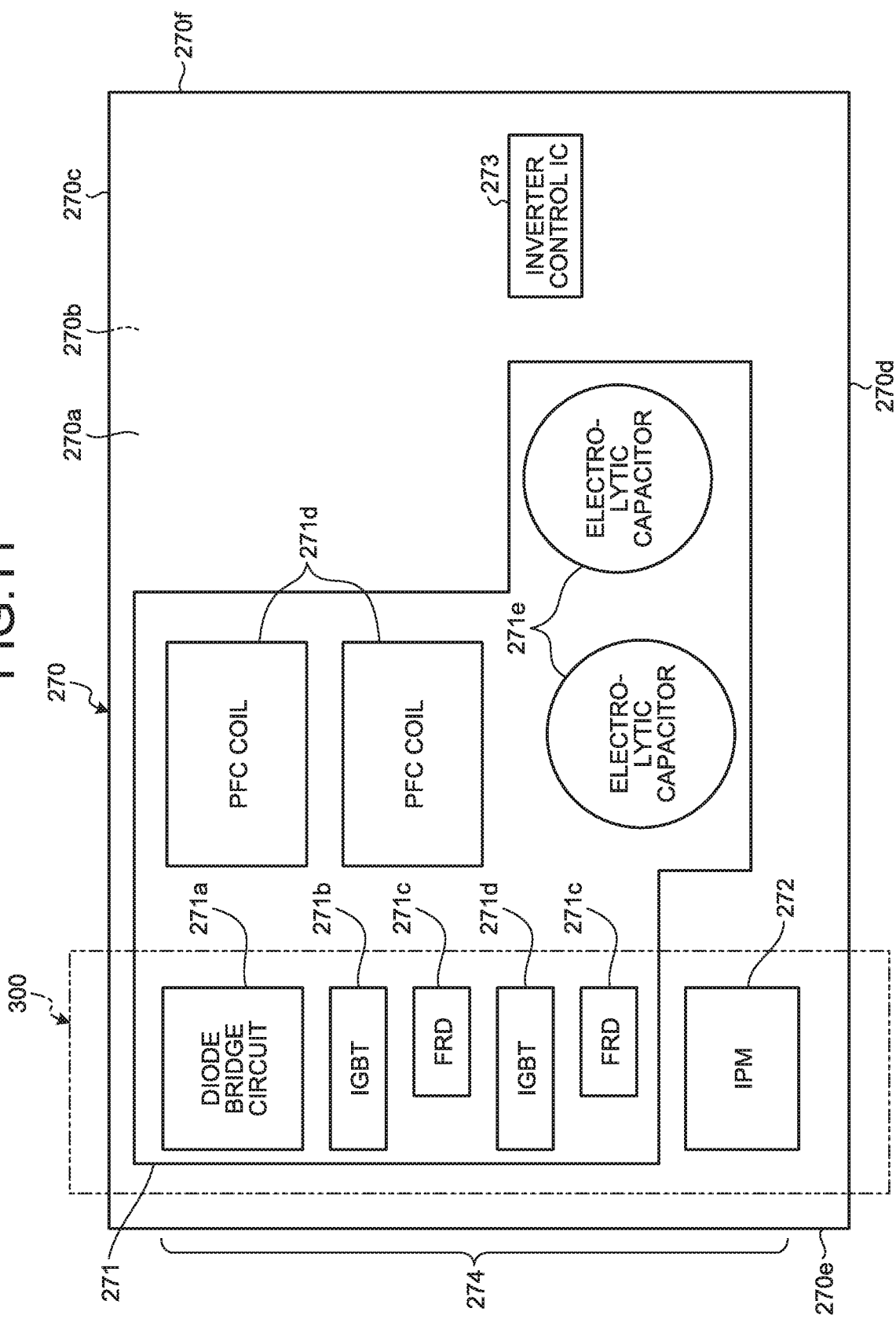
FIG. 11 is a front view of a power board.

On the front surface 270a of the power board 270, the electronic components forming the remaining part of the control circuit, including the plurality of power devices 274 described later, are mounted as described above. Specifically, as illustrated in FIG. 11, the components mounted include: a diode bridge circuit 271a for rectification; two insulated gate bipolar transistor (IGBT) elements 271b having a reduced operation resistance achieved with a MOSFET provided in the gate part of a bipolar transistor; two fast recovery diode (FRD) elements 271c for high speed operation; two power factor correction (PFC) coils 271d for power factor correction; and two aluminum electrolytic capacitors 271e for high power smoothing. The diode bridge circuit 271a, the IGBT elements 271b, the FRD elements 271c, the PFC coils 271d, the electrolytic capacitors 271e, and the like form a converter circuit 271 that converts AC power supplied from the outside and outputs the resultant power. Furthermore, an intelligent power module (IPM) element 272 and an inverter control IC 273 are mounted to form an inverter circuit with a drive circuit and a self-protection function. The inverter circuit converts the DC power supplied from the converter circuit 271 into AC power and outputs the AC power. The reference numeral 270b denotes the back surface of the power board 270. The power board 270 is formed in a rectangular shape and has an upper end 270c, a lower end 270d, a left end 270e, and a right end 270f. Each of the diode bridge circuit 271a, the IGBT elements 271b, the FRD elements 271c, and the IPM element 272 is the power device 274 that produces a large amount of heat. These components are mounted in a vertical arrangement near the left end 270e so as to be more effectively coolable by the cooler 300. The power board 270 is mounted on the back surface 211b to have the back surface 270b facing the back surface 211b of the main body portion 211 of the fixed plate 210. The cooler 300 faces and is in contact with portions of the plurality of power devices 274.

Then, the size of the power board 270 in the upward and downward direction is set to correspond to the size of the plurality of power devices 274 in the vertically arrangement, and the PFC coils 271d, the electrolytic capacitors 271e, and the inverter control IC 273, and the like are arranged to be within this size in the upward and downward direction. Thus, the vertical size of the power board 270 is set to be slightly larger than the upward and downward direction size of the plurality of power devices 274 in the vertical arrangement. The size of the main board 260 in the upward and downward direction is set to be substantially the same as the size of the power board 270 in the upward and downward direction. The AC input current detection/temperature detection circuit 261, the actuator drive circuit 262, the display setting circuit 263, the main control IC 264, the EMC filter circuit 265, the switching power circuit 266, the inrush current control circuit 267, the connectors 268, and the like are mounted to be within this size. The IGBT elements 271b may be replaced with a MOSFET.

The electronic components mounted on the main board 260 and the power board 270 described above are merely examples, and can be changed without departing from the spirit of the present invention. The electronic components mounted on the main board 260 are low voltage electronic components that operate at a low voltage, and the electronic components mounted on the power board 270 are high voltage electronic components that operate at a high voltage. The high voltage electronic components produce a larger amount of heat and noise compared with the low voltage electronic components.

Figure 5:
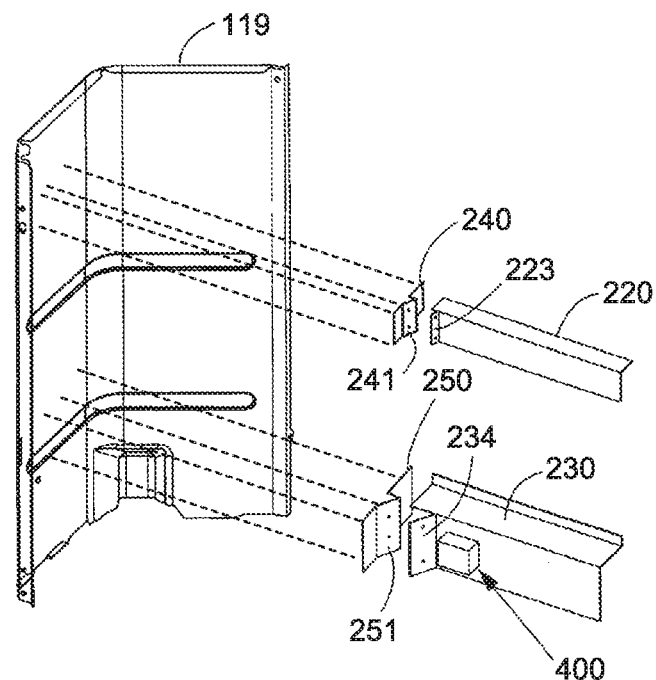
FIG. 5 is a diagram illustrating how an upper frame and a lower frame are attached to a partition plate.

For arranging the electrical component module 200 in the machine section 110B of the outdoor unit 100, first of all, the attachment metal fitting 240 having an inclined surface 241 and the attachment metal fitting 250 having an inclined surface 251 are mounted on the partition plate 119 in advance. Then, as illustrated in FIG. 5, the attachment piece 223 of the upper frame 220 is screwed to the inclined surface 241 of the attachment metal fitting 240, and the attachment piece 234 of the lower frame 230 is screwed to the inclined surface 251 of the attachment metal fitting 250. As a result, the upper frame 220 and the lower frame 230 are attached to the partition plate 119 in a cantilevered manner, to extend along the lateral direction.

Figure 6:
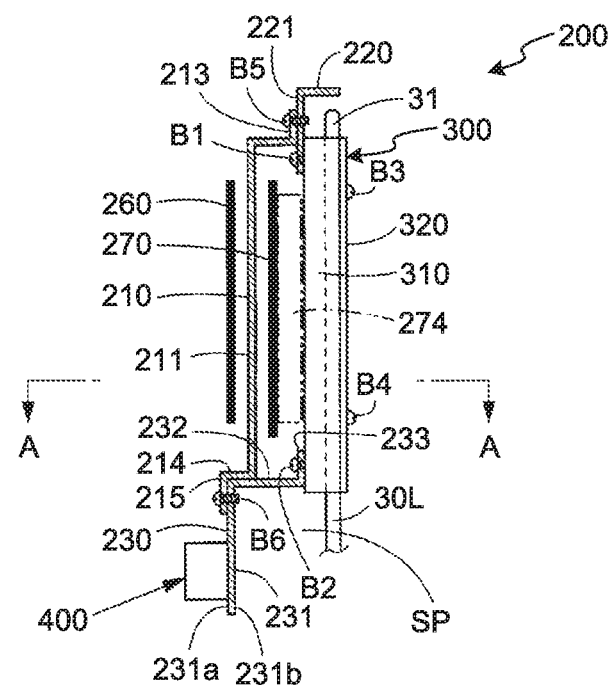
FIG. 6 is a vertical cross-sectional view of the electrical component module.
Figure 7:
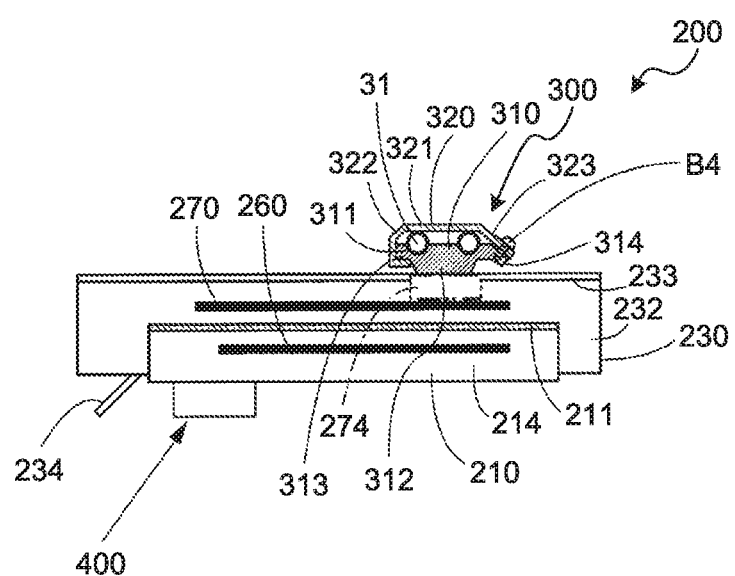
FIG. 7 is a cross-sectional view taken along line A-A in FIG. 6.
Figure 8:
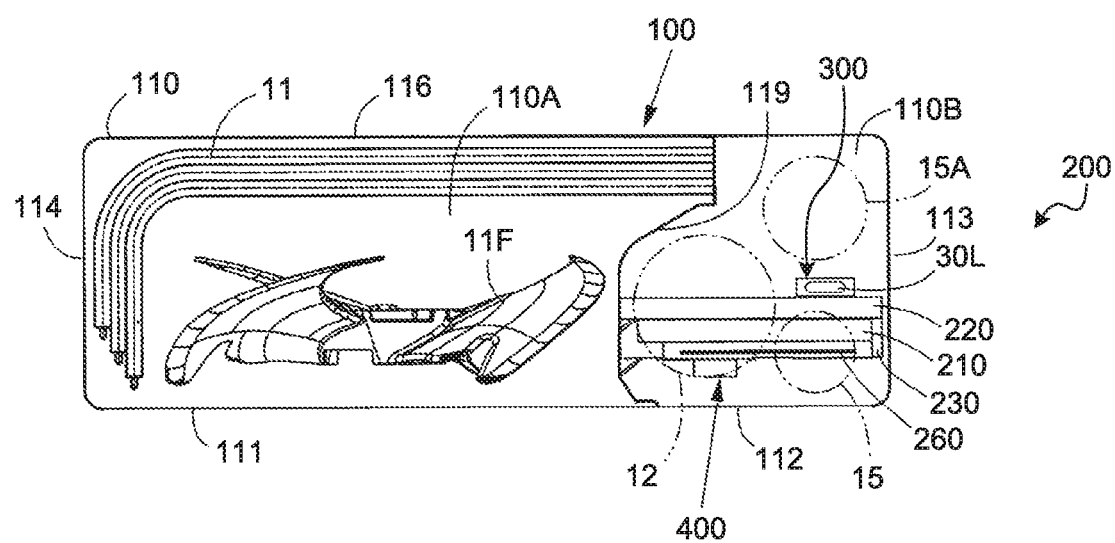
FIG. 8 is a plan view of the outdoor unit with a top panel removed.
Figure 9:
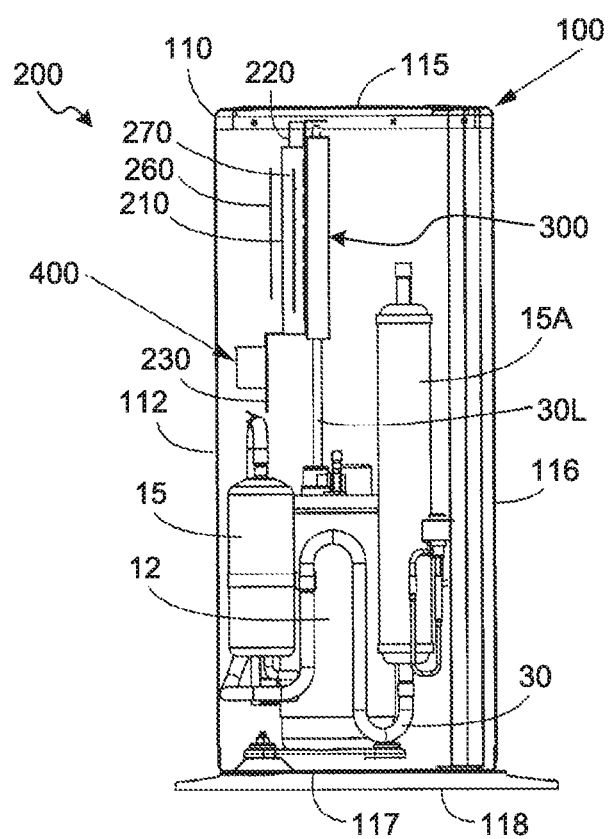
FIG. 9 is a right side view of the outdoor unit with a right side panel removed.

Next, as illustrated in FIG. 6, the heat sink 310 of the cooler 300 is installed using screws B1 and B2, so as to bridge between the end portion 224 of the vertical piece 221 of the upper frame 220 and the end portion 235 of the upper vertical piece 233 of the lower frame 230. Furthermore, as illustrated in FIG. 7, the U-shaped bent portion 31 of the refrigerant pipe 30L is pressed into the grooves 311 of the heat sink 310, the hook portion 322 of the cover 320 is engaged with one cover attachment portion 313 of the heat sink 310, the attachment portion 323 is pressed against the other cover attachment portion 314 of the heat sink 310, and the attachment portion 323 is fixed to the cover attachment portion 314 using screws B3 and B4. This work is performed with the back panel 116 of the outdoor unit 100 removed. With the operation described above, the cooler 300 is arranged so as to bridge between the end portion 224 of the upper frame 220 and the end portion 235 of the lower frame 230, with the thick plate portion 312 of the heat sink 310 facing the direction toward the service panel 112.

The main board 260 is mounted on the front surface 211a of the main body portion 211 of the fixed plate 210, and the power board 270 is mounted on the back surface 211b. Then, the fixed plate 210 on which the main board 260 and the power board 270 are mounted is attached using the screws B5 and B6 with the upper vertical piece 213 overlapped on the vertical piece 221 of the upper frame 220 and the lower vertical piece 215 overlapped on the lower vertical piece 231 of the lower frame 230. The fixed plate 210 is tightly fixed because the attachment piece 223 of the upper frame 220 and the attachment piece 234 of the lower frame 230 are attached to the partition plate 119 respectively via the attachment metal fitting 240 and the attachment metal fitting 250, and the other end 224 of the upper frame 220 and the other end 235 of the lower frame 230 are fixed to the U-shaped bent portion 31 of the liquid side refrigerant pipe 30L via the cooler 300. In addition, the plurality of power devices 274 of the power board 270 is pressed against the thick plate portion 312 of the heat sink 310 of the cooler 300, for thermal coupling therebetween. Thus, when the air conditioner starts operating, the heat produced by the power devices 274 is cooled by the cooler 300. If the thick plate portion 312 of the heat sink 310 is coated with thermal grease having high thermal conductivity, the thermal coupling can further be improved. After the electrical component module 200 has been attached to the machine section 110B as described above, a plug to which required wiring is connected is connected to the connector 268 of the main board 260 of the electrical component module 200, and another required wiring is connected to the terminal board 400.

Figure 12:
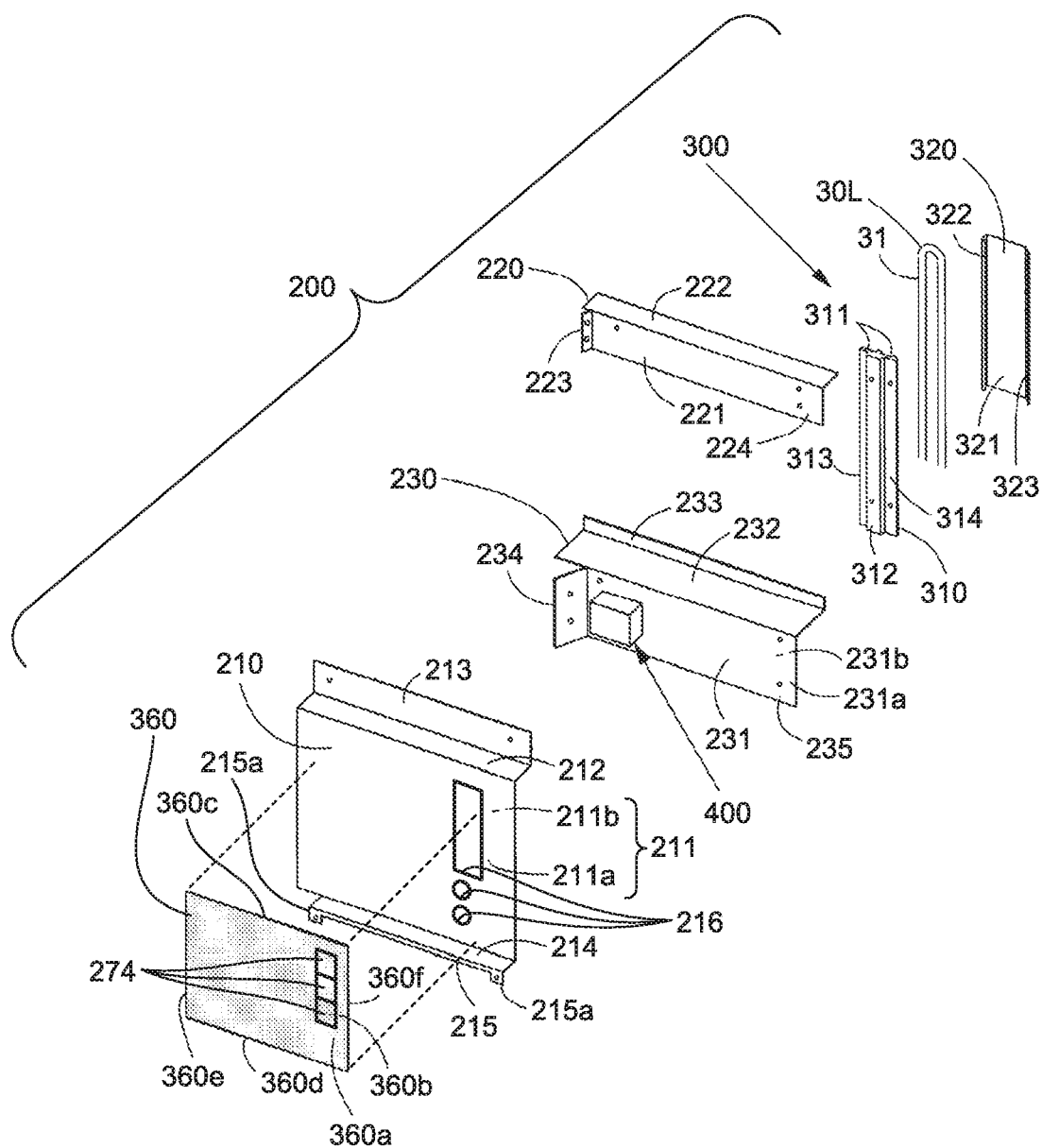
FIG. 12 is a perspective view of an electrical component module according to a modification of the embodiment.
Figure 13:
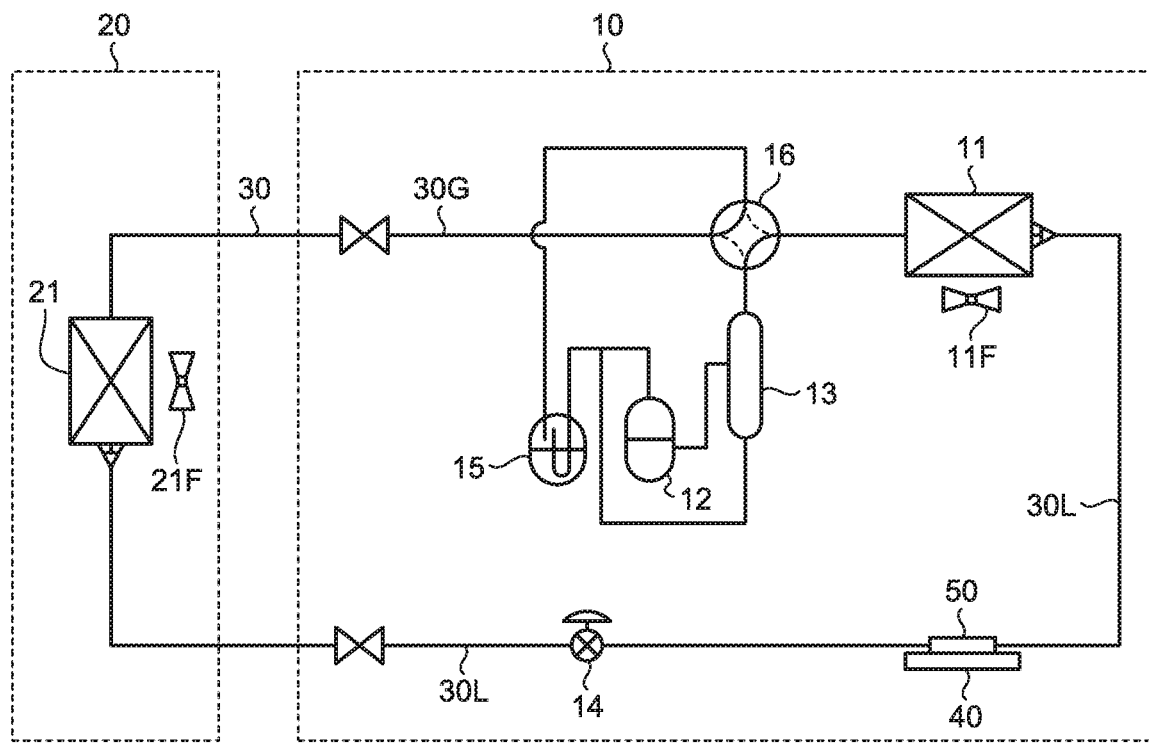
FIG. 13 is a circuit diagram of a refrigerant circuit of an air conditioner.
Figure 14:
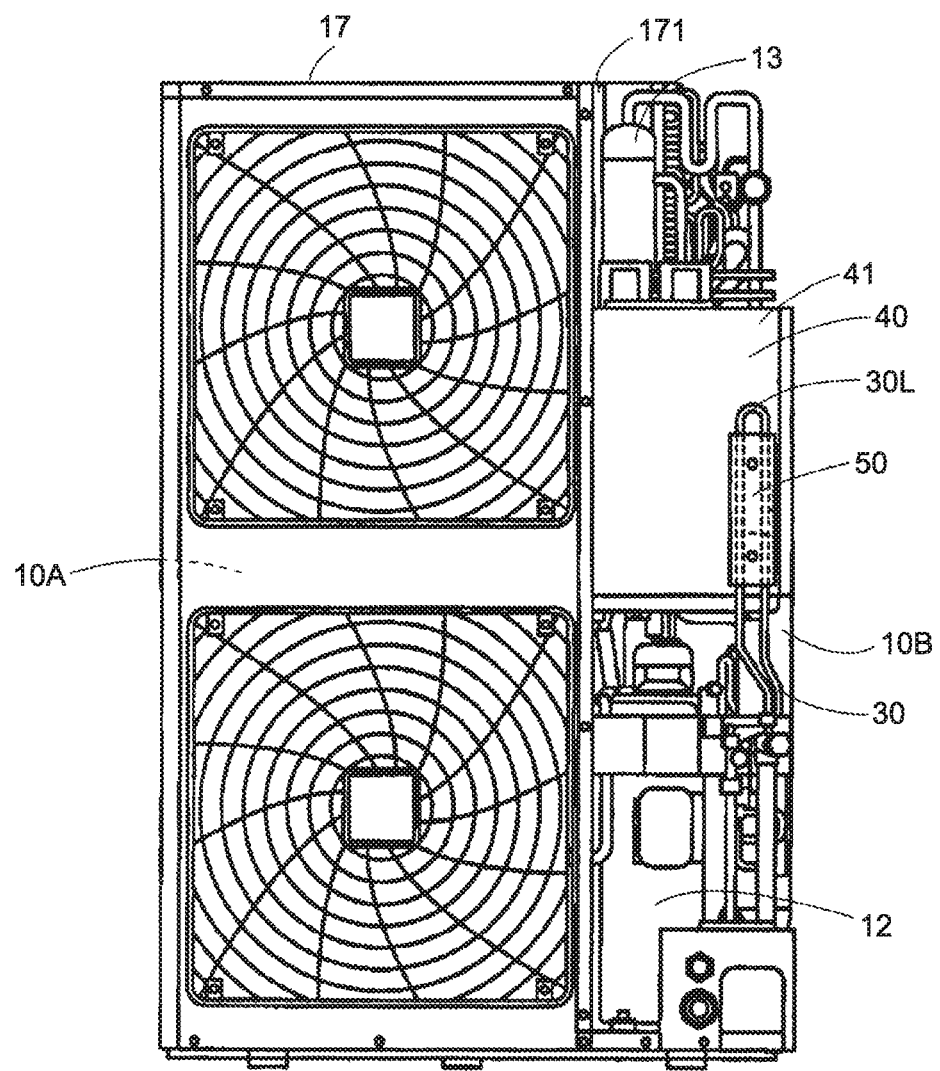
FIG. 14 is a front view of a conventional outdoor unit with a service panel removed.
Figure 15:
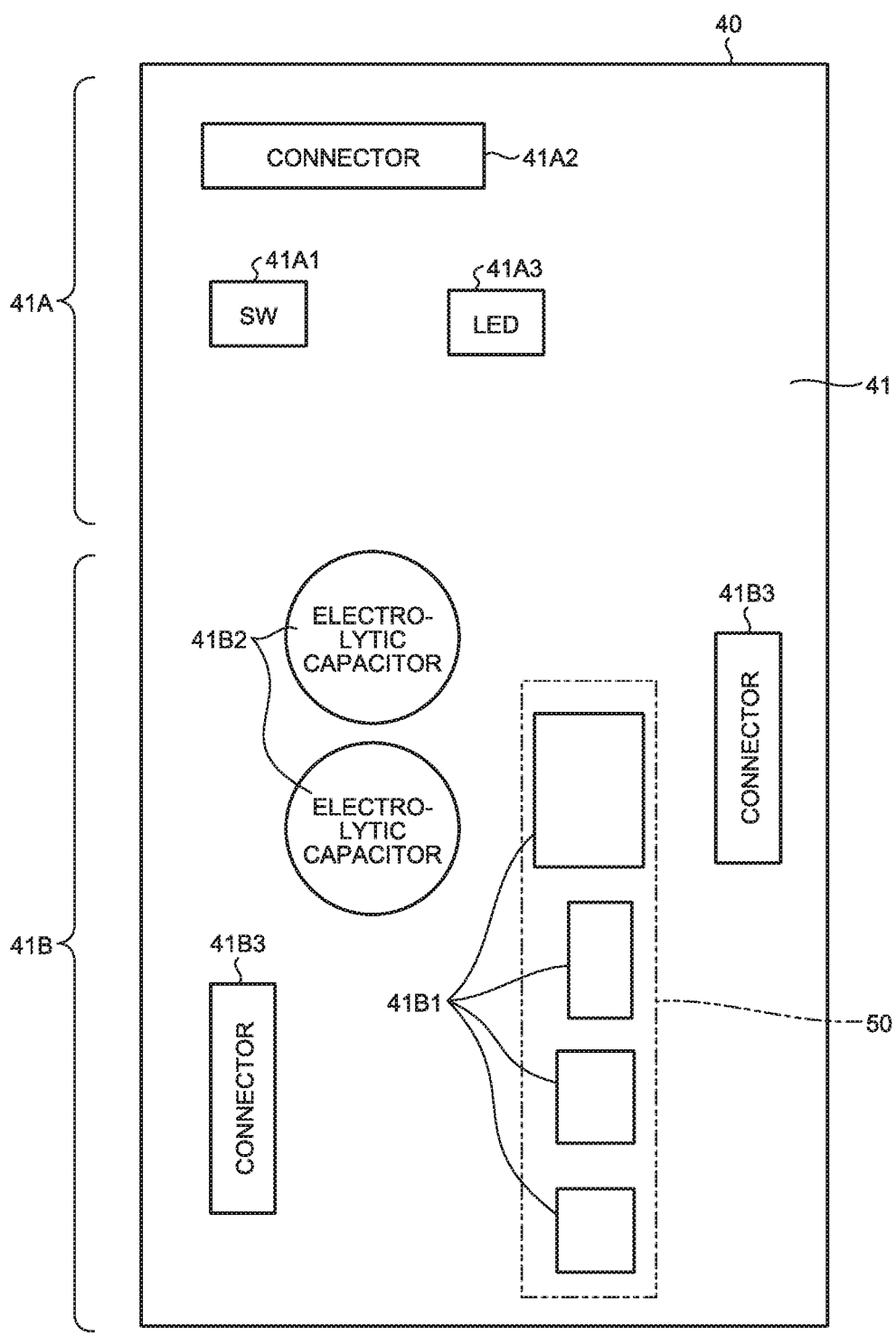
FIG. 15 is a front view of a conventional electrical component module.

The electrical component module 200 described above has two printed circuit boards that are the main board 260 and the power board 270, but may be configured to include only one printed circuit board. FIG. 12 is a perspective view of an electrical component module 200 according to a modification of the embodiment.

As illustrated in FIG. 12, a single printed circuit board 360 is fixed on the front surface 211a of the fixed plate 210 to have a front surface 360a facing the direction toward the service panel 112 (see FIG. 8) and to have a back surface 360b facing the front surface 211a of the fixed plate 210. In the printed circuit board 360, the printed circuit board 360 according to the modification is a single board in which the main board 260 having the front surface 260a on which electronic components forming a part of the control circuit and the power board 270 having the front surface 270a on which electronic components including the plurality of power devices 274 and forming the remaining part of the control circuit are collectively configured. The printed circuit board 360 is formed in a rectangular shape and has an upper end 360c, a lower end 360d, a left end 360g, and a right end 360f.

The plurality of power devices 274 is provided on at least one of the front surface 360a and the back surface 360b of the printed circuit board 360. When the power devices 274 are provided on the front surface 360a of the printed circuit board 360, the power devices 274 protrudes on the side of the back surface 360b of the printed circuit board 360 through a through hole (not illustrated) of the printed circuit board 360.

The fixed plate 210 is provided with openings 216 for thermally coupling the plurality of power devices 274, mounted on the printed circuit board 360, with the cooler 300. The openings 216 are formed at positions that face the power devices 274. The power devices 274 of the printed circuit board 360 attached to the fixed plate 210 are in contact with the thick plate portion 312 of the heat sink 310 of the cooler 300 through the openings 216.

Instead of the openings 216, a notched portion (not illustrated) through which the power devices 274 of the printed circuit board 360 pass may be formed in an outer circumference portion of the fixed plate 210. The fixed plate 210 is not limited to the structure having the openings 216 and the notched portion. For example, the power devices 274 of the printed circuit board 360 may be arranged on the outer circumference side of the fixed plate 210 to be thermally coupled with the cooler 300 over the outer circumference portion of the fixed plate 210.

As described above, the electrical component module 200 according to the present embodiment includes: the fixed plate 210 on which the control circuit is mounted, the fixed plate 210 being arranged to have the front surface 211a facing the direction toward the service panel 112; and the cooler 300 attached to a part of the refrigerant pipe 301 with the refrigerant pipe 301 sandwiched between the back surface 211b of the fixed plate 210 and the cooler 300. This allows maintenance work to be easily performed on the printed circuit board 360 (or the main board 260 and the power board 270) of the control circuit without the need for removing the cooler 300 from the machine section 110B when the maintenance work is performed on the printed circuit board 360 (or the main board 260 and the power board 270) of the control circuit. The electrical component module 200 further includes: the upper frame 220 having an elongated shape with which the upper portion of the fixed plate 210 is attached to the machine section 110B; and the lower frame 230 having an elongated shape with which the lower portion of the fixed plate 210 is attached to the machine section 110B. The cooler 300 is attached to bridge between the upper frame 220 and the lower frame 230. As described above, the upper frame 220 and the lower frame 230 are connected to each other via the fixed plate 210 and via the cooler 300. Thus, the mechanical strength of a supporting structure for the main board 260, the power board 270, and the printed circuit board 360 supported by the fixed plate 210, the upper frame 220, and the lower frame 230 can be improved with a simple structure. More specifically, in the electrical component module 200, the cooler 300 also serves as a part of the supporting structure for the main board 260, the power board 270, and the printed circuit board 360, so that the supporting structure can be simplified.

By the way, when only a single printed circuit board 360 is used in the outdoor unit 100 (FIG. 12), the low voltage electronic components are provided in the low voltage region and the high voltage electronic components are provided in the high voltage region, with the components arranged along the upward and downward direction of the single printed circuit board 360. When the low voltage electronic components and the high voltage electronic components are thus arranged in series along the upward and downward direction of the printed circuit board 360, the printed circuit board 360 needs to have a large size in the upward and downward direction. Thus, such a printed circuit board 360 is difficult to apply to an outdoor unit with a machine section not having much space in the upward and downward direction. In view of this, the printed circuit board 360 is preferably divided into two printed circuit boards (the main board 260 and the power board 270) to be separately mounted on the front surface 211a and the back surface 211b of the fixed plate 210. Meanwhile, if there is a difference between the main board 260 and the power board 270 in the upward and downward direction size, the effect of dividing the printed circuit board 360 into two boards is compromised.

In view of this, in the present embodiment, the main board 260 and the power board 270 in a back-to-back state are mounted on the fixed plate 210 via the fixed plate 210 attached to the machine section 110B. Thus, the size of the main board 260 and the power board 270 in the upward and downward direction can be substantially reduced from the size of the printed circuit board in the upward and downward direction in the case where the main board 260 and the power board 270 are arranged in series in the upward and downward direction to be a single board. Thus, this configuration can be effectively applied to the outdoor unit including a housing without much space in the upward and downward direction.

In this configuration, the electronic components other than the power devices 274 are distributed between the main board 260 and the power board 270 with the upward and downward direction size of the power board 270 set to correspond to the size of the plurality of power devices 274 arranged in the upward and downward direction, and with the size of the main board 260 set to be the same as or substantially the same as the upward and downward direction size. Thus, the main board 260 and the power board 270 can have small sizes in the upward and downward direction.

Furthermore, the lower vertical piece 231 of the lower frame 230 protrudes toward the front surface beyond the fixed plate 210 due to the upper horizontal piece 232, and the terminal board 400 is attached to the front surface 231a of the lower vertical piece 231. Thus, the terminal board 400 protrudes forward so as to be easily accessible, and a wide space SP can be provided to the back surface 231b of the lower vertical piece 231. Thus, the lower frame 230 does not interfere with a pipe and the like to be arranged in the space SP.

The plurality of power devices 274 mounted on the power board 270 is thermally coupled with the cooler 300 on the back surface 211b side of the fixed plate 210, and is simply pressed against the cooler 300. Thus, by loosening the screws B5 and B6, the fixed plate 210, the main board 260, and the power board 270 can be integrally removed from the front surface of the machine section 110B without the cooler 300 hindering this operation, whereby maintenance work can be easily performed on the main board 260 and the power board 270.

Furthermore, display setting circuit 261 including LED lamp 263a, DIP switch 263b, button switch 263c, and the like and the plurality of connectors 268 are mounted on the front surface 260a of the main board 260. This enables operations such as checking the operation status of the air conditioner by checking the display status of the LED lamp 263a, changing the setting contents by operating the DIP switch 263b, the button switch 263c, and the like, and switching the circuit connection by inserting or pulling out a plug to and from the connectors 268 to be easily performed, by simply removing the service panel 112 from the outdoor unit 100.

REFERENCE SIGNS LIST

30L Liquid side refrigerant pipe
31 U-shaped bent portion
100 Outdoor unit
110 Housing
110A Heat exchange section
110B Machine section
111 Front panel
112 Service panel
113 Right side panel
114 Left side panel
115 Top panel
116 Back panel
117 Lower side panel
118 Stand
119 Partition plate
200 Electrical component module
210 Fixed plate
211 Main body portion
211a Front surface
211b Back surface
212 Upper horizontal piece
213 Upper vertical piece
214 Lower horizontal piece
215 Lower vertical piece
216 Opening
220 Upper frame
221 Vertical piece
222 Horizontal piece 223 Attachment piece
230 Lower frame
231 Lower vertical piece
232 Upper horizontal piece
233 Upper vertical piece
234 Attachment piece
240 Attachment metal fitting
250 Attachment metal fitting
260 Main board
260a Front surface
260b Back surface
270 Power board
270a Front surface
270b Back surface
274 Power device
300 Cooler
310 Heat sink
320 Cover
360 Printed circuit board
400 Terminal board

The invention claimed is:

1. An electrical component module attached to a machine section provided behind a service panel arranged on a front side of an outdoor unit of an air conditioner including a refrigerant pipe, the electrical component module comprising:
a control unit that controls the air conditioner;
a fixed plate on which the control unit is mounted, the fixed plate being arranged to have a front surface facing a direction toward the service panel;
a cooler that is attached to a part of the refrigerant pipe with the refrigerant pipe arranged between the cooler and a back surface of the fixed plate;
a first frame attached to an upper end portion of the fixed plate, and having an elongated shape extending along the service panel from one end to another end; and
a second frame attached to a lower end portion of the fixed plate, and having an elongated shape extending along the service panel from one end to another end,
wherein
the control unit includes a printed circuit board on which a power device is mounted,
the power device is thermally coupled with the cooler,
the cooler is attached to bridge between the first frame and the second frame,
a partition plate is attached to the outdoor unit to partition between the machine section and a heat exchange section,
the fixed plate includes a first vertical piece configured to be fixed at the upper end portion to the first frame along a longitudinal direction of the first frame and a second vertical piece configured to be fixed at the lower end portion to the second frame along a longitudinal direction of the second frame, the first vertical piece and the second vertical piece extending along the service panel, and
the one end of the first frame and the one end of the second frame are attached to the partition plate and the other end of the first frame and the other end of the second frame are attached to the cooler.

2. The electrical component module according to claim 1, wherein
the fixed plate is provided with an opening or a notched portion with which the power device on the printed circuit board is thermally coupled with the cooler.

3. The electrical component module according to claim 1, wherein
the printed circuit board includes a main board having a front surface on which an electronic component forming a part of the control unit is mounted and a power board having a front surface on which an electronic component including a plurality of the power devices and forming a remaining part of the control unit is mounted,
the fixed plate on which the main board and the power board are mounted is attached to the machine section, with a back surface of the main board facing the front surface of the fixed plate, with a back surface of the power board facing the back surface of the fixed plate, and with the front surface of the main board facing the direction toward the service panel,
the plurality of power devices is vertically arranged on the front surface of the power board and are thermally coupled with the cooler,
the fixed plate is arranged with a direction of connection between the upper end portion and the lower end portion being in parallel with an upward and downward direction,
the power board has a size in the upward and downward direction set to correspond to a size of the plurality of power devices vertically arranged in the upward and downward direction, and
the main board has a size in the upward and downward direction set to correspond to the size of the power board in the upward and downward direction.

4. The electrical component module according to claim 1, wherein
the power device is positioned between the other end of the first frame and the other end of the second frame.

5. The electrical component module according to claim 1, wherein
the cooler includes a heat sink that is thermally coupled with the power device and a cover with which the heat sink is attached to a part of the refrigerant pipe.

6. The electrical component module according to claim 1, wherein
the first vertical piece and the second vertical piece are fixed to the first frame and the second frame by using screws, which are rotated around an axis orthogonal to a panel surface of the service panel, from a side of the service panel.

* * * * *